US009807907B2

(12) United States Patent
Lee et al.

(10) Patent No.: US 9,807,907 B2
(45) Date of Patent: Oct. 31, 2017

(54) AIR CONDITIONER WITH ELECTRONIC DEVICE COUPLED TO COOLING TUBE

(71) Applicant: LG ELECTRONICS INC., Seoul (KR)

(72) Inventors: Hakjin Lee, Seoul (KR); Taegeol Kim, Seoul (KR); Seokhoon Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 409 days.

(21) Appl. No.: 14/487,539

(22) Filed: Sep. 16, 2014

(65) Prior Publication Data

US 2015/0077939 A1 Mar. 19, 2015

(51) Int. Cl.
  *F25D 23/12* (2006.01)
  *H05K 7/20* (2006.01)
  (Continued)

(52) U.S. Cl.
  CPC ......... *H05K 7/2029* (2013.01); *F25B 31/006* (2013.01); *H05K 7/2039* (2013.01); *H05K 7/20318* (2013.01); *F25B 13/00* (2013.01); *F25B 40/02* (2013.01); *F25B 2400/075* (2013.01); *F25B 2400/077* (2013.01);
  (Continued)

(58) Field of Classification Search
  CPC ............. H05K 7/20318; H05K 7/2039; H05K 7/20418; H05K 7/2029; H05K 7/20354
  See application file for complete search history.

(56) References Cited

U.S. PATENT DOCUMENTS

| 2010/0101242 A1 | 4/2010 | Froelich et al. | |
| 2011/0126568 A1* | 6/2011 | Okuda | F24F 1/24 62/259.2 |

(Continued)

FOREIGN PATENT DOCUMENTS

| CN | 1752610 | 3/2006 |
| CN | 102066849 | 5/2011 |

(Continued)

OTHER PUBLICATIONS

Chinese Office Action dated Aug. 26, 2016 issued in Application No. 201410471473.X (with English translation).

(Continued)

*Primary Examiner* — Orlando E Aviles Bosques
(74) *Attorney, Agent, or Firm* — KED & Associates, LLP

(57) ABSTRACT

An air conditioner is provided. The air conditioner may include an electronic device, which may include a control component to drive a refrigerant cycle, and a cooling tube through which a refrigerant to cool the electronic device may flow. The cooling tube may be coupled to one side of the electronic device. The electronic device may include an electronic case having at least one through hole, an electronic board to which the control component may be coupled, the electronic board being disposed in the electronic case, at least one heat transfer plate disposed to contact the control component, the at least one heat transfer plate being coupled to the electronic case, and at least one heat sink, to which the cooling tube may be coupled, the at least one heat sink contacting the at least one heat transfer plate through the at least one through hole.

23 Claims, 6 Drawing Sheets

(51) Int. Cl.
*F25B 31/00* (2006.01)
*F25B 13/00* (2006.01)
*F25B 40/02* (2006.01)

(52) U.S. Cl.
CPC ... *F25B 2400/13* (2013.01); *F25B 2700/1931* (2013.01); *F25B 2700/21151* (2013.01); *F25B 2700/21152* (2013.01)

(56) References Cited

U.S. PATENT DOCUMENTS

2013/0298588 A1* 11/2013 Jojima ............... H02J 7/00
　　　　　　　　　　　　　　　　62/259.2
2014/0138073 A1* 5/2014 Teraki ............... H01L 23/473
　　　　　　　　　　　　　　　　165/178

FOREIGN PATENT DOCUMENTS

| CN | 102713462 | 10/2012 |
|----|-----------|---------|
| EP | 0 933 603 A1 | 8/1999 |
| EP | 2 314 940 A1 | 4/2011 |
| EP | 2 522 931 A1 | 11/2012 |
| JP | 2008-121966 | 5/2006 |
| WO | WO 2010-087481 | 8/2010 |
| WO | WO 2013/001829 A1 | 1/2013 |

OTHER PUBLICATIONS

European Search Report dated May 26, 2015.
European Search Report issued in Application No. 14184899.4 dated Feb. 5, 2015.

* cited by examiner

AIR CONDITIONER WITH ELECTRONIC DEVICE COUPLED TO COOLING TUBE

CROSS-REFERENCE TO RELATED APPLICATION(S)

The present application claims priority under 35 U.S.C. 119 and 35 U.S.C. 365 to Korean Patent Application No. 10-2013-0110929, filed in Korea on Sep. 16, 2013, which is hereby incorporated by reference in its entirety.

BACKGROUND

1. Field

An air conditioner is disclosed herein.

2. Background

Air conditioners are home appliances that maintain indoor air in a proper state according to use and purpose. For example, such an air conditioner may maintain indoor air in a cold state in summer and in a warm state in winter. Further, the air conditioner may maintain a humidity of the indoor air and purify the indoor air to a pleasant and clean state.

In more detail, the air conditioner has a refrigerant cycle in which compression, condensation, expansion, and evaporation processes of a refrigerant are repeatedly performed. Thus, a cooling or heating operation of the air conditioner may be performed to cool or heat the indoor air according to the refrigerant cycle.

Air conditioners may be classified into split type air conditioners, in which indoor and outdoor units or devices are separated from each other, and integral type air conditioners, in which indoor and outdoor units or devices are integrally coupled to each other as a single unit or device according to whether the indoor and outdoor units are separated from each other. The outdoor unit may include an outdoor heat exchanger that heat-exchanges with external air, and the indoor unit may include an indoor heat exchanger that heat-exchanges with indoor air.

When a refrigerant cycle performs a cooling operation, the outdoor heat exchanger may serve as a condenser and the outdoor heat exchanger may serve as an evaporator. On the other hand, when the refrigerant cycle performs a heating operation, the indoor heat exchanger may serve as the condenser and the outdoor heat exchanger may serve as the evaporator.

An electronic unit or device to drive the air conditioner may be disposed within the outdoor unit. The electronic unit may include a plurality of control components. While the air conditioner is driven, a large amount of heat may be generated by the electronic unit. The electronic unit may generate heat having a temperature of about 70° C. to about 80° C.

In the air conditioner according to the related art, if the electronic unit is not sufficiently cooled, malfunction of the control components may occur. As a result, the function (heat exchange operation) of the air conditioner may not be sufficiently performed, or the air conditioner may break down.

To cool the electronic unit, a board having high thermal conductivity may be disposed on or at a side of the electronic unit, and then a device, for example, a heat-sink, that heat-exchanges with external air may be provided in the air conditioner according to the related art. However, the heat-sink may have a limitation in that an effect thereof is limited in an area in which external air has a relatively high temperature (for example, about 50° C.).

Thus, to solve the above-described limitation, technology, in which a cooling device to allow a refrigerant within the refrigeration cycle to flow may be provided at a side of the electronic unit to heat-exchange a refrigerant with the electronic unit, thereby cooling the electronic unit, has been introduced in recent years. The cooling device may include a refrigerant tube, for example.

The cooling device may be maintained in a state in which it is coupled to the electronic unit. If repairing of the electronic unit or replacement of the control components is needed, the cooling device or the refrigerant tube has to be removed. Then, after the repairing or replacement is finished, the cooling device or the refrigerant tube has to be reassembled, and then a refrigerant has to be recharged.

BRIEF DESCRIPTION OF THE DRAWINGS

Embodiments will be described in detail with reference to the following drawings in which like reference numerals refer to like elements, and wherein.

DETAILED DESCRIPTION

Hereinafter, embodiments will be described with reference to the accompanying drawings. Embodiments may, however, be embodied in many different forms and should not be construed as being limited to the embodiments set forth herein; rather, alternate embodiments included in other retrogressive inventions or falling within the spirit and scope will fully convey the concept to those skilled in the art.

Figure 1:
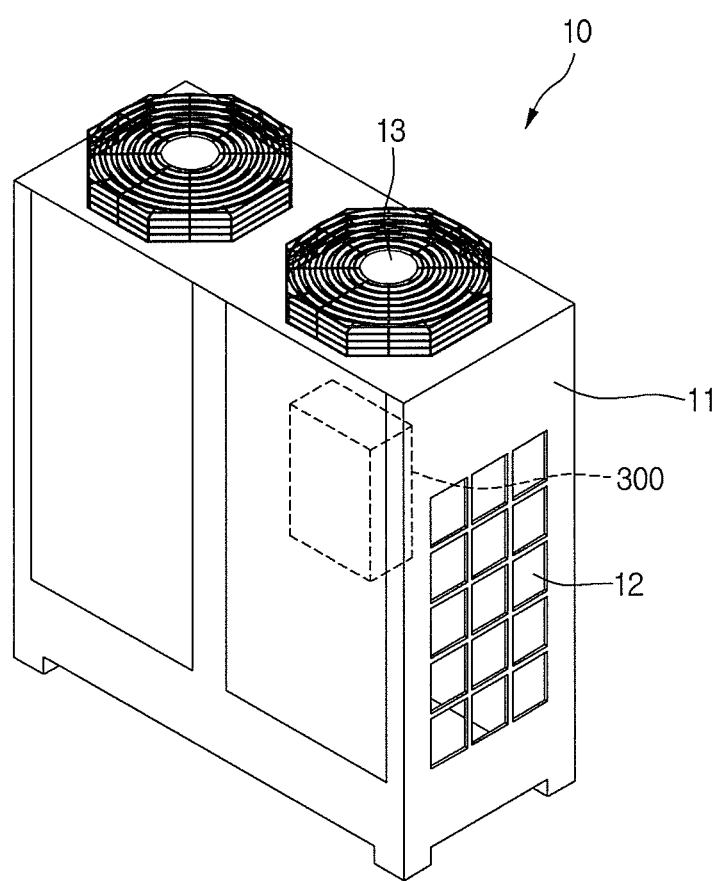
FIG. 1 is a schematic perspective view of an exterior of an outdoor device according to an embodiment.
Figure 2:
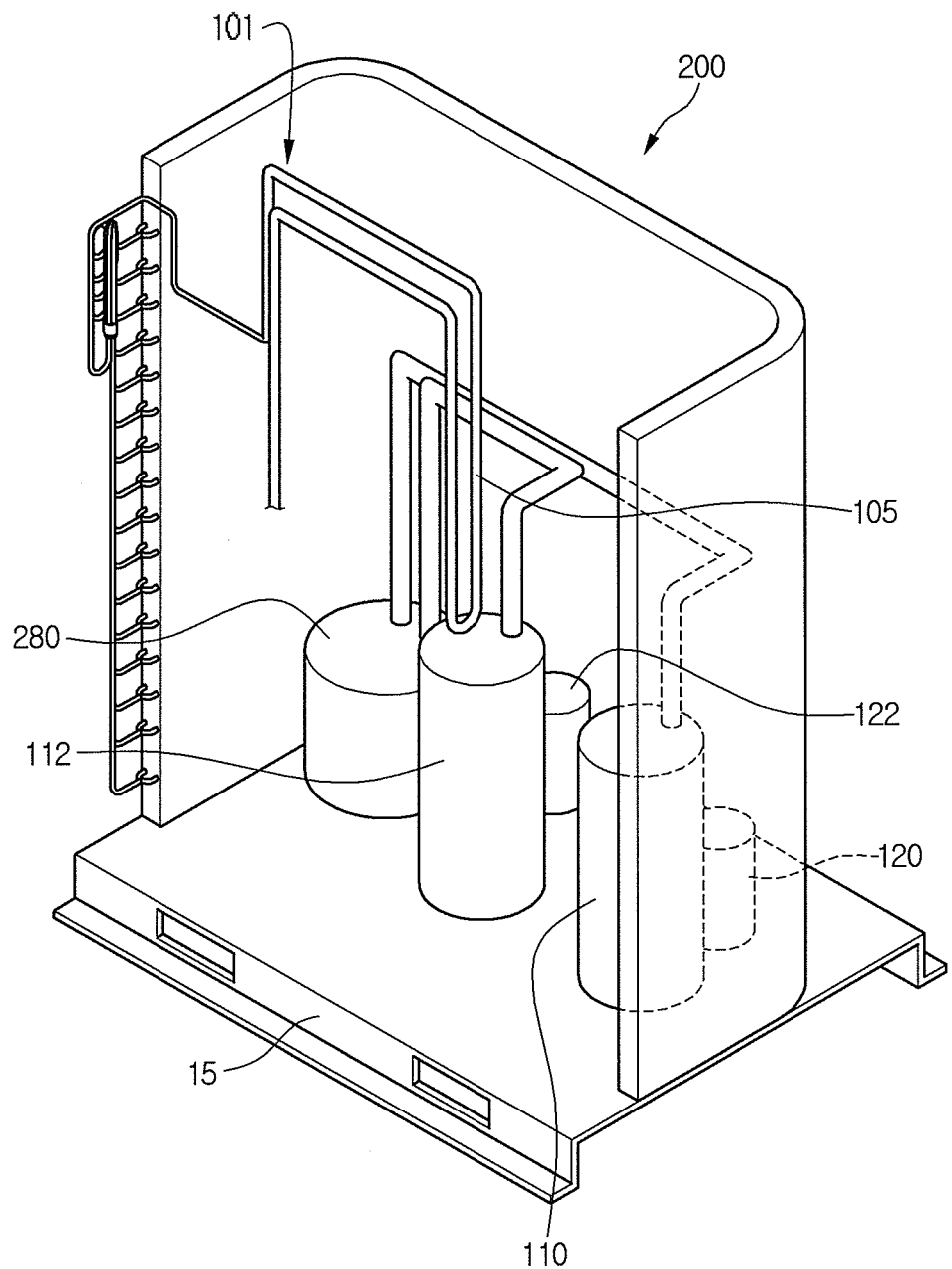
FIG. 2 is a schematic perspective view of internal components of the outdoor device of FIG. 1.

FIG. 1 is a schematic perspective view of an exterior of an outdoor device according to an embodiment. FIG. 2 is a perspective view of internal components of the outdoor device of FIG. 1.

Referring to FIGS. 1 and 2, an air conditioner according to an embodiment may include an outdoor unit or device 10 that heat-exchanges with outdoor air and an indoor unit or device (not shown) disposed in an indoor space to condition indoor air. The outdoor device 10 may include a case 11 that defines an outer appearance thereof and includes a plurality of built-in components. The case 11 may include a suction portion 12, through which the outdoor air may be suctioned in, and a discharge portion 13, through which the suctioned air may be discharged after the suctioned air is heat-exchanged. For example, the suction portion 12 may be disposed in a side surface of the case 11, and the discharge portion 13 may be disposed in a top surface of the case 11.

The case 11 may include a plurality of compressors 110 and 112 to compress a refrigerant, a gas/liquid separator 280 to filter a liquid refrigerant from the refrigerant suctioned into the plurality of compressors 110 and 112, oil separators 120 and 122 coupled, respectively, to sides of the plurality of compressors 110 and 112 to separate an oil from the refrigerant discharged from the compressors 110 and 112, and an outdoor heat exchanger 200 that heat-exchanges with the outdoor air. The plurality of compressors 110 and 112, the gas/liquid separator 280, and the outdoor heat exchanger 200 may be disposed on a base 15 of the outdoor device 10. The base 15 may define a bottom surface of the outdoor device 10.

The outdoor device 10 may further include a refrigerant tube 101 to guide the circulated refrigerant into the outdoor device 10, that is, the refrigerant flowing into the plurality of compressors 110 and 112, the gas/liquid separator 280, and the outdoor heat exchanger 200. The refrigerant tube 101 may include a cooling tube 105 coupled to a side of an electronic case 301 to cool an electronic device 300. The electronic device 300 may be separably coupled to an inner surface of the case 11 of the outdoor device 10. Components of the electronic device 30 will be described with reference to the accompanying drawings.

Figure 3:
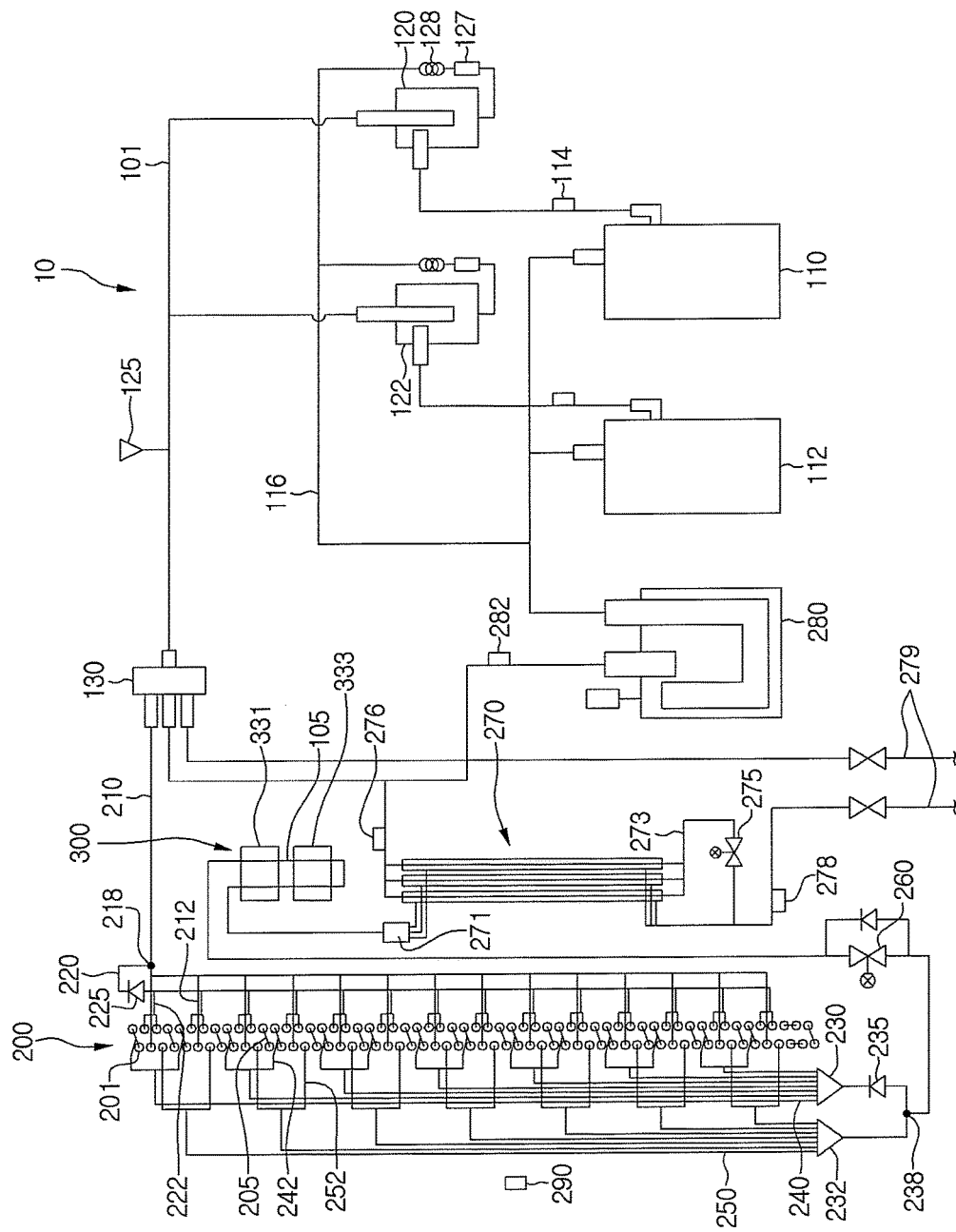
FIG. 3 is a system view of components of the outdoor device of FIG. 1.

FIG. 3 is a system view of components of the outdoor device of FIG. 1. Referring to FIG. 3, the outdoor device 10 according to embodiments may include the plurality of compressors 110 and 112, and the oil separators 120 and 122 disposed on outlet-sides of the plurality of compressors 110 and 112 to separate oil from the refrigerant discharged from the plurality of compressors 110 and 112. The plurality of compressors 110 and 112 may include a first compressor 110 and a second compressor 112, which may be connected in parallel to each other. A discharge temperature sensor 114 to detect a temperature of the compressed refrigerant may be disposed on an outlet-side of each of the first and second compressors 110 and 112.

The oil separators 120 and 122 may include a first oil separator 120 disposed on an outlet-side of the first compressor 110 and a second oil separator 122 disposed on an outlet-side of the second compressor 112. The outdoor device 10 may include a collection passage 116 to pass the oil from the oil separators 120 and 122 into the compressors 110 and 112. The collection passage 116 may extend from each of outlet-sides of the first and second oil separators 120 and then be combined with each other. The combined passage may be connected to an inlet-side tube of each of the first and second compressors 110 and 112.

A high-pressure sensor 125 to detect a discharge pressure of the refrigerant discharged from the compressors 110 and 112, and a flow switch 130 to guide the refrigerant passing through the high-pressure sensor 125 to the outdoor heat exchanger 200 or the indoor device may be disposed on the outlet-sides of the oil separators 120 and 122. For example, the flow switch 130 may include a four-way valve.

When the air conditioner operates in a cooling mode, the refrigerant may be introduced from the flow switch 130 into the outdoor heat exchanger 200. On the other hand, when the air conditioner operates in a heating mode, the refrigerant may flow from the flow switch 130 into an indoor heat exchange-side of the indoor device (not shown).

When the air conditioner operates in the cooling mode, the refrigerant condensed in the outdoor heat exchanger 200 may pass through a main expansion valve 260, for example, an electric expansion valve (EEV), provided in or at an outlet-side of the outdoor heat exchanger 200. When the cooling operation is performed, the main expansion valve 260 may be fully opened, and thus, may not perform decompression of the refrigerant.

The refrigerant passing through the main expansion valve 260 may pass through heat-sink plates 331 and 333 disposed along the cooling tube 105. That is, when the cooling operation is performed, the cooling tube 105 may be disposed on or at an outlet-side of the main expansion valve 260.

The heat-sink plates 331 and 333 may be disposed on the electronic device 300, which includes a component that generates heat, and the cooling tube 105 may be coupled to the heat-sink plates 331 and 333. The refrigerant flowing into the cooling tube 105 may cool the component.

The outdoor device 10 may further include a supercooling heat exchanger 270, to which the refrigerant passing through the heat-sink plates 331 and 333, may be introduced, and a supercooling distributor 271 disposed on an inlet-side of the supercooling heat exchanger 270 to branch or distribute the refrigerant. The supercooling heat exchanger 270 may serve as an intermediate heat exchanger, in which a first refrigerant circulated in the system and a portion (a second refrigerant) of the first refrigerant may be heat-exchanged with each other after the refrigerant is branched or distributed.

The first refrigerant may be a refrigerant which is introduced into the supercooling heat exchanger 270 via the supercooling distributor 271, and thus, may be supercooled by the second refrigerant. On the other hand, the second refrigerant may absorb heat from the first refrigerant.

The outdoor device 10 may include a supercooling passage 273 disposed on an outlet-side of the supercooling heat exchanger 270 to branch or distribute the second refrigerant from the first refrigerant. A supercooling expansion device 275 to decompress the second refrigerant may be disposed in the supercooling passage 273. The supercooling expansion device 275 may include an electric expansion valve (EEV).

The second refrigerant of the supercooling passage 273 may be introduced into the supercooling heat exchanger 270, and then, may be heat-exchanged with the first refrigerant to flow toward an inlet-side of the gas/liquid separator 280. The outdoor device 10 may further include a supercooling discharge temperature sensor 276 to detect a temperature of the second refrigerant passing through the supercooling heat exchanger 270.

The gas/liquid separator 280 may be configured to separate a gaseous refrigerant from the refrigerant before the refrigerant is introduced into the compressors 110 and 112. The separated gaseous refrigerant may be introduced into the compressors 110 and 112.

While the refrigeration cycle is driven, evaporated refrigerant may be introduced into the gas/liquid separator 280 via the flow switch 130. The evaporated refrigerant may be mixed with the second refrigerant passing through the supercooling heat exchanger 270, and then, may be introduced into the gas/liquid separator 280.

A suction temperature sensor 282 to detect a temperature of the refrigerant to be suctioned into the compressors 110 and 112 may be disposed on or at the inlet-side of the gas/liquid separator 280.

The first refrigerant passing through the supercooling heat exchanger 270 may be introduced into the indoor device 10 through an indoor device connection tube 279. The outdoor device 10 may further include a liquid tube temperature sensor 278 disposed on or at an outlet-side of the supercooling heat exchanger 270 to detect a temperature of the first refrigerant passing through the supercooling heat exchanger 270, that is, a temperature of the supercooled refrigerant.

The outdoor heat exchanger 200 may include a heat exchange tube 201 having a plurality of rows and stages. For example, a plurality of the heat exchange tube 201 may be provided, and the plurality of heat exchange tubes 201 may be arranged in two rows in a horizontal direction and stepped in a plurality of stages in a vertical direction.

The outdoor heat exchanger 200 may further include a return tube 205 coupled to ends of the plurality of heat exchange tubes 201 to guide the refrigerant flowing into one heat exchange tube 201 toward another heat exchange tube 201. A plurality of the return tubes 205 may be provided.

The outdoor device 10 may further include a first connection tube 210 that extends from the flow switch 130 to a tube (hereinafter, referred to as a first row tube) forming one row of the plurality of heat exchange tubes 201. The first connection tube 210 may include a plurality of first branch tubes 212 to branch the refrigerant into the plurality of heat exchange tubes 201 forming the first row tube.

The outdoor device 10 may further include a second connection tube 220 branched from the first connection tube 210 to extend to a tube (hereinafter, referred to as a second row tube) forming another row of the plurality of heat exchange tubes 201. The second connection tube 220 may include a plurality of second branch tubes 222 that branches the refrigerant into the plurality of heat exchange tubes 201 forming the second row tube.

A first branch 218 may be disposed in the first connection tube 210. The second connection tube 220 may be branched from the first connection tube 210 at the first branch 218. A first check valve 225, which may guide a flow of the refrigerant in one direction, may be disposed in the second connection tube 220. Here, the term "one direction" may be understood as a direction in which the refrigerant flows from the second connection tube 220 into the first connection tube 210. Thus, when the air conditioner operates in the cooling mode, the refrigerant flowing into the first connection tube 210 may be limited to flow in a direction of the second connection tube 220 through the first branch 218.

The outdoor device 10 may further include a plurality of distribution devices 230 and 232 to branch and introduce the refrigerant into the outdoor heat exchanger 200 when the heating operation is performed. The plurality of distribution devices 230 and 232 may include a first distribution device 230 to branch the refrigerant into the plurality of return tubes 205, and a second distribution device 232 to branch the refrigerant into the plurality of heat exchange tubes 201.

The outdoor device 10 may further include a second branch 238 to distribute the refrigerant to the first and second distribution devices 230 and 232. When the air conditioner operates in the heating mode, the refrigerant may be distributed into the first and second distribution devices 230 and 232 via the second branch 238, and then, may be introduced into the outdoor heat exchanger 200.

The outdoor device 10 may further include a plurality of third connection tubes 240 that extends from the first distribution device 230 to the plurality of return tubes 205. The third connection tube 240 may include a plurality of third branch tubes 242 coupled to the plurality of return tubes 205 to branch or distribute the refrigerant into the plurality of return tubes 205.

The outdoor device 10 may further include a plurality of fourth connection tubes 250 that extends from the second distribution device 232 to the plurality of heat exchange tubes 201. The plurality of fourth connection tubes 250 may include a plurality of fourth branch tubes 252 to branch or distribute the refrigerant into the plurality of heat exchange tubes 201.

The outdoor device 10 may further include a second check valve 235, which may guide a flow of the refrigerant in one direction, and may be disposed on a side of the outdoor heat exchanger 200. The second check valve 235 may be disposed on an inlet-side of the first distribution device 230 when the heating operation is performed. Here, the term "one direction" may be understood as a direction in which the refrigerant flows from the first distribution device 230 to the third connection tube 240 or the third branch tube 242. Thus, the introduction of the refrigerant, which may flow into the third connection tube 240 or the third branch tube 242, into the first distribution device 230 may be limited by the second check valve 235.

The outdoor device 10 further include an outdoor temperature sensor 290 disposed in the outdoor device 10 to detect a temperature of external air.

Figure 4:
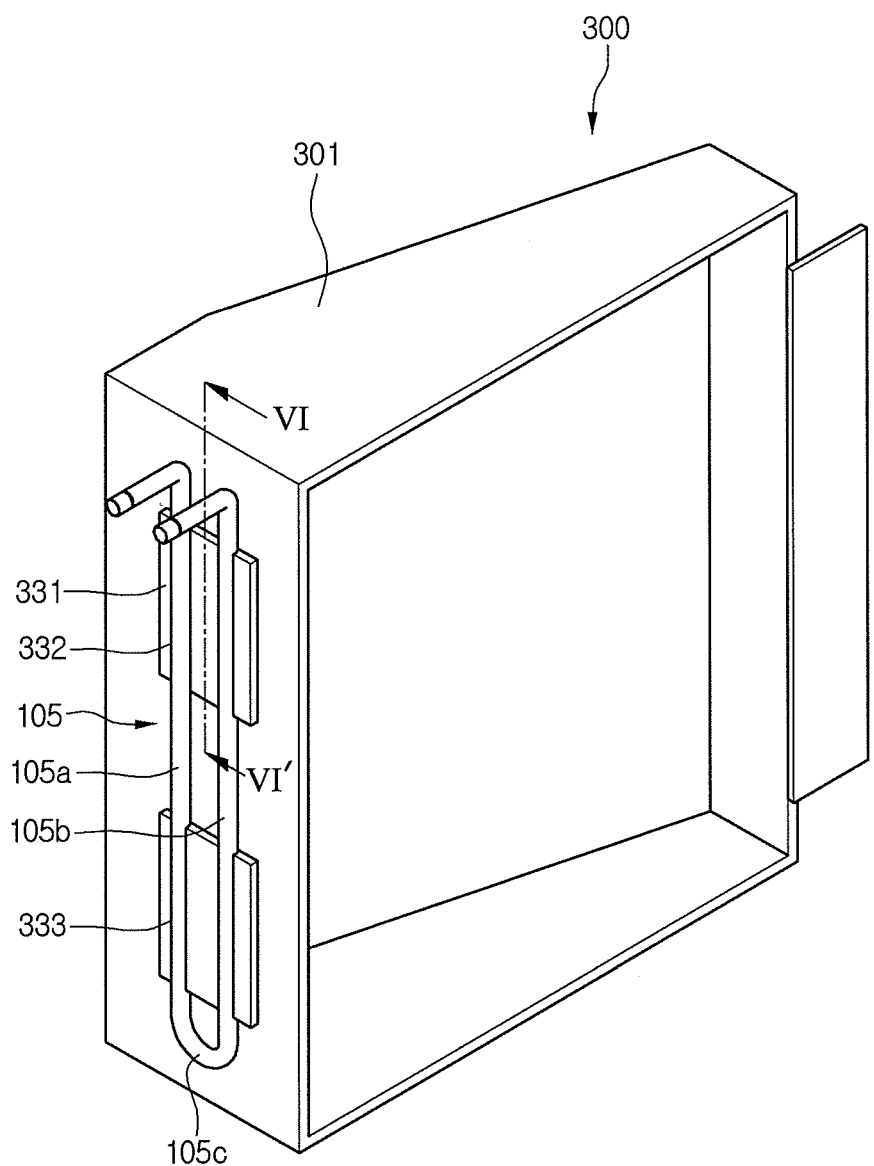
FIG. 4 is a schematic perspective view of a portion of an electronic device according to an embodiment.
Figure 5:
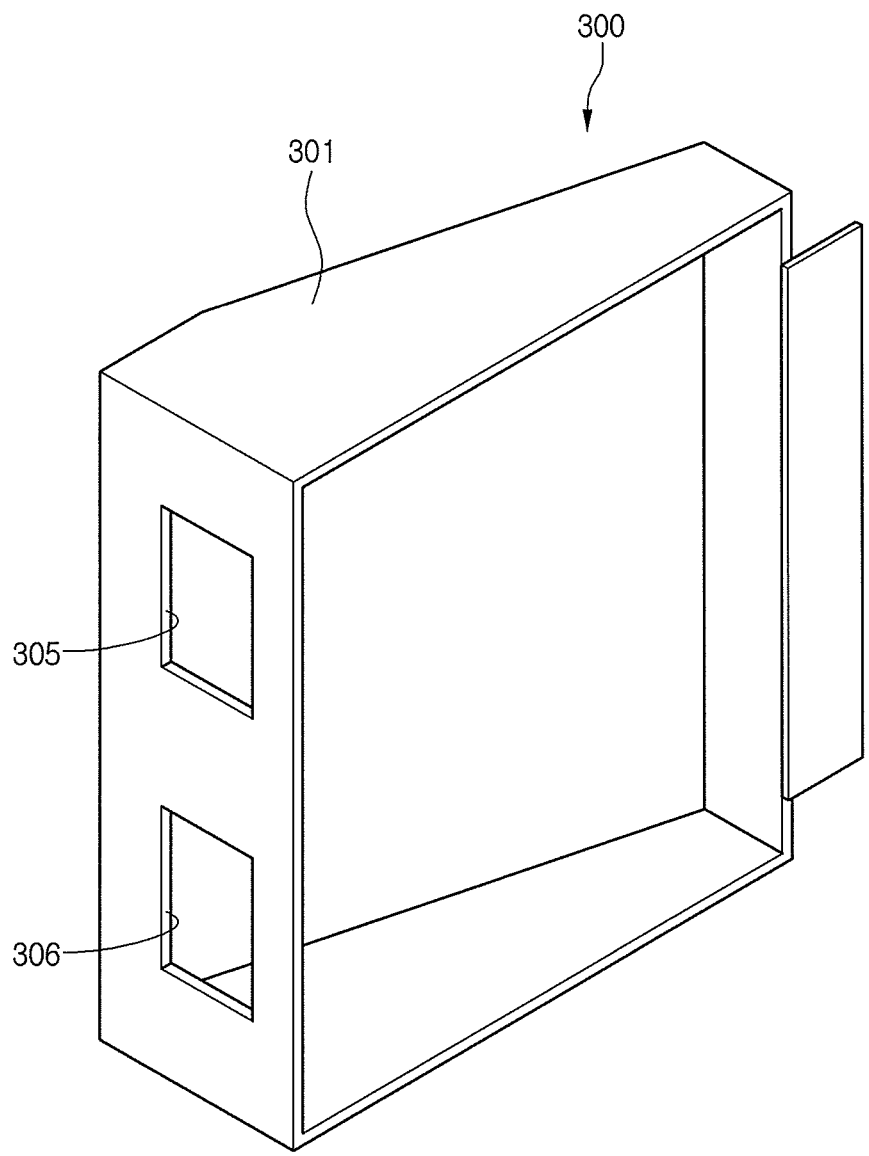
FIG. 5 is a schematic perspective view of an electronic case according to an embodiment.
Figure 6:
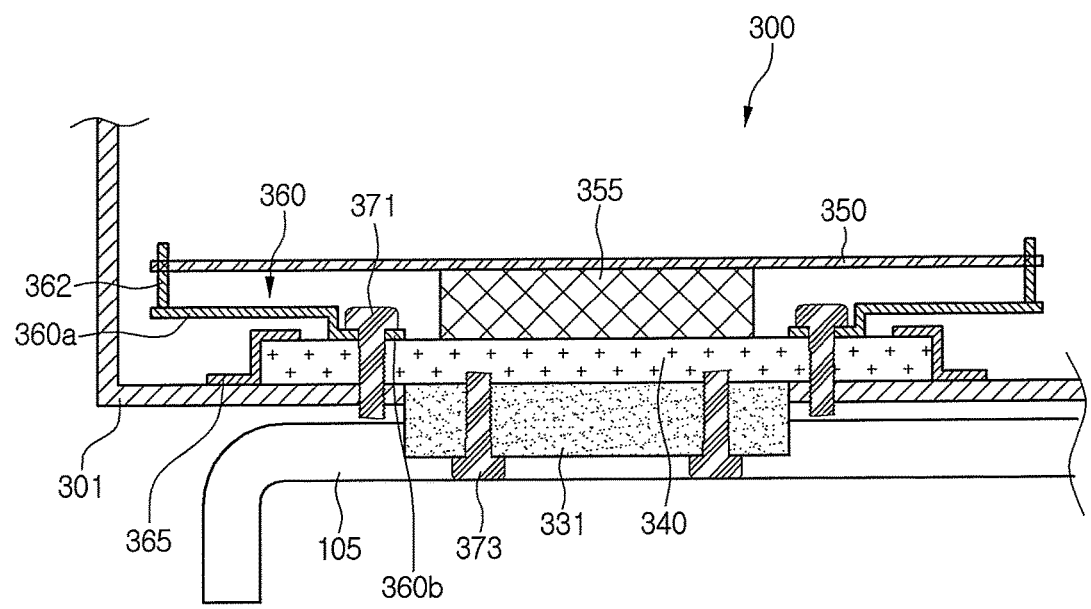
FIG. 6 is a cross-sectional view taken along line VI-VI' of FIG. 4.

FIG. 4 is a schematic perspective view of a portion of an electronic device according to an embodiment. FIG. 5 is a schematic perspective view of an electronic case according to an embodiment. FIG. 6 is a cross-sectional view taken along line VI-VI' of FIG. 4.

Referring to FIGS. 4 and 5, the electronic device 300 according to embodiments may include the electronic case 301, which may define a predetermined inner space therein. An electronic board 350 and a plurality of control components disposed on the electronic board 350 may be disposed within the electronic case 301. The plurality of control components may include a component 355 that generates high-temperature heat.

For example, the component 355 may include a power module, for example, an intelligent power module (IPM). The IPM may be understood as a driving circuit of a power device, such as a power MOSFET or IGBT, and a protection circuit having a self protection function. The power module may be called a "power device". Also, the electronic board 350 may be a portion of the IPM. When the power module is driven, a switching device provided in the power module may be turned on or off generating heat having a temperature of about 70° C. to about 80° C. In addition, the component 355 may include a micron computer, an inverter, a converter, an EEPROM, a rectifier diode, or a condenser. The component 355 may be disposed within the electronic case 301.

The plurality of heat-sink plates 331 and 333 to cool the electronic device 300 may be separably coupled to the electronic device 300. The plurality of heat-sink plates 331 and 333 may include first and second heat-sink plates 331 and 333, which may be spaced apart from one side surface of the electronic case 301.

A plurality of heat-sink plate coupling portions 305 and 306, to which the plurality of heat-sink plates 331 and 333 may be coupled, may be disposed in the electronic case 301. The plurality of heat-sink plate coupling portions 305 and 306 may pass between the inside and the outside of the electronic case 301. The heat-sink plate coupling portions 305 and 306 may be called "through holes".

The heat-sink coupling portions 305 and 306 may include a first heat-sink plate coupling portion 305, to which the first heat-sink plate 331 may be coupled, and a second heat-sink plate coupling portion 306, to which the second heat-sink plate 333 may be coupled.

Each of the first and second heat-sink plates 331 and 333 may be formed of a metal having superior thermal conductivity or thermal conductive plastic. The thermal conductive plastic may be understood as a material having properties of plastic, that is, a small weight, a free design, and a low thermal expansion coefficient and heat transfer properties of metal and ceramic. For example, each of the plurality of heat-sink plates 331 and 333 may include aluminum as the metal material.

As another example, each of the plurality of heat-sink plates 331 and 333 may include polyethylene ($-[CH_2CH_2]n-$) in which ethylene is polymerized and carbon nanotube (CNT) as the thermal conductive plastic. The thermal conductive plastic may have a thermal conductivity greater by about 100 times than that of general plastic.

At least a portion of the first and second heat-sink plates 331 and 333 may be inserted into the heat-sink plate coupling portions 305 and 306, respectively. The first and second heat-sink plates 331 and 333 may be coupled to contact a heat transfer plate 340 through the first and second heat-sink plate coupling portions 305 and 306. That is, the first and second heat-sink plate coupling portions 305 and 306 may provide spaces through which the first and second heat-sink plates 331 and 333 may be coupled to heat transfer plate 340.

An insertion portion 332, into which the cooling tube 105 may be placed or inserted, may be defined in each of the first and second heat-sink plates 331 and 333. The insertion portion 332 may be formed by recessing at least a portion of each of the first and second heat-sink plates 331 and 333. A plurality of the insertion portion 332 may be provided. The cooling tube 105 may be a bent or curved shape, so that the cooling tube 105 may be coupled to the plurality of insertion portions 332. The insertion portion 332 may be referred to as a "refrigerant passage" in that the insertion portion 332 may provide a passage through which the refrigerant may flow.

In more detail, the cooling tube 105 may include a first cooling tube 105a to guide a flow of the refrigerant in a first direction, and a second cooling tube to guide a flow of the refrigerant in a second direction. The cooling tube 105 may further include a switching tube 105c coupled between the first cooling tube 105a and the second cooling tube 105b. The switching tube 105c may be rounded or bent to switch a flow direction of the refrigerant.

For example, when the air conditioner operates in the cooling mode, the refrigerant may flow along the first heat-sink plate 331 through the first cooling tube 105a and then along second heat-sink plate 333 to perform cooling. Also, the refrigerant may be again introduced into the second cooling tube 105b via the switching tube 105c to successively pass along the second heat-sink plate 333 and the first heat-sink plate 331. With this process, the refrigerant may perform the cooling again.

As described above, the refrigerant that performs cooling two times may flow toward the supercooling distributor 271. Heat generated in the electronic device 300 may have a temperature of about 70° C. to about 80° C. Also, as the refrigerant passing through the outdoor heat exchanger 200 and the main expansion valve 260 has a temperature of about 30° C., the refrigerant may effectively cool the electronic device 300.

Referring to FIG. 6, the arrangement of the electronic board 350, the component 355 coupled to the electronic board 350 and generating a predetermined heat, and the heat transfer plate 340 disposed to contact the component 355 may transfer the heat of the component 355 outside of the electronic case 301. The heat transfer plate 340 may be closely attached to an inner surface of the electronic case 301. The heat transfer plate 340 may have a first side surface that contacts the component 355 and a second side surface that contacts the first and second heat-sink plates 331 and 333 through the first and second heat-sink plate coupling portions 305 and 306. In a state in which the first and second heat-sink plates 331 and 333 are separated from the electronic case 301, when viewed from outside of the electronic case 301, the heat transfer plate 340 may be seen through the first and second heat-sink plate coupling portions 305 and 306.

The component 355 and the heat transfer plate 340 may be disposed between the inner surface of the electronic case 301 and the electronic board 350. That is, the electronic board 350 may be disposed at a position which is spaced apart from the heat transfer plate 340. Also, the component 355 may be disposed between the electronic board 350 and the heat transfer plate 340.

The electronic device 300 may further include a fixing guide 360 to fix the electronic board 350 at the position which is spaced apart from the heat transfer plate 340. The fixing guide 360 may be coupled to the electronic board 350 and the heat transfer plate 340 and may be disposed on each of both sides of the electronic board 350.

In more detail, the fixing guide 360 may include a first guide 360a coupled to the electronic board 350 by a fixing device 362, and a second guide 360b bent to extend from the first guide 360a and coupled to the heat transfer plate 340 by a first coupling member 371.

The fixing device 362 may be a device to fix the first guide 360a and the electronic board 350 in a state in which the first guide 360a and the electronic board 350 are spaced apart from each other. Thus, the fixing device 362 may be called a spacer. The fixing device 362 may be separably coupled between the electronic board 350 and the first guide 360a of the fixing guide 360. Thus, the electronic board 350 may be easily fixed to the heat transfer plate 340 by the fixing guide 360 in a state in which the electronic board 350 is spaced apart from the heat transfer plate 340.

The first coupling member 371 may be understood as a coupling member to couple the fixing guide 360 and the heat transfer plate 340 to the electronic case 301. In more detail, the first coupling member 371 may pass through the fixing guide 360 and the heat transfer plate 340, and then, may be coupled to the electronic case 301. That is, the fixing guide 360, the heat transfer plate 340, and the electronic case 301 may be coupled at the same time by the first coupling member 371. For example, the first coupling member 371 may include a screw.

A coupling guide 365 to guide coupling of the heat transfer plate 340 may be disposed on the inner surface of the electronic case 301. The coupling guide 365 may be disposed on each of both sides of the heat transfer plate 340 to support the heat transfer plate 340.

The coupling guide 365 may have a bent shape. Also, at least a portion of the coupling guide 365 may be coupled to the inner surface of the electronic case 301, and the rest of the coupling guide 365 may be coupled to a side surface of the heat transfer plate 340.

The heat transfer plate 340 may be separably inserted into an inner space defined by the two coupling guides 365. For example, the heat transfer plate 340 may be slidably coupled to or separated from the inner space of the two coupling guides 365.

The heat transfer plate 340 may be supported by the coupling guides 365. Thus, the coupling guides 365 may prevent the heat transfer plate 340 from being separated toward the inside of the electronic case 301.

The first and second heat-sink plates 331 and 333, which may be disposed to contact the heat transfer plate 340, thereby transferring heat of the component 355 into the cooling tube 105, may be provided outside of the electronic case 301. That is, the first and second heat-sink plates 331 and 333 may be supported by an outer surface of the electronic case 301. As the first and second heat-sink plates 331 and 333 may have the same coupling structure, the first heat-sink plate 331 will be described as an example.

The first heat-sink plate 331 may be inserted into the first heat-sink plate coupling portion 305 to contact a surface of the heat transfer plate 340. The heat transfer plate 340 may be closely attached to the inner surface of the electronic case 301 and may not protrude outward from the first heat-sink plate coupling portion 305. Both sides of the heat transfer plate 340 may be supported by the inner surface of the electronic case 301. That is, components disposed outside the electronic case 301 may be limited by the first heat-sink plate 331.

The first heat-sink plate 331 and the heat transfer plate 340 may be coupled to each other by a second coupling member 373. The second coupling member 373 may be understood as a coupling member to couple the first heat-sink plate 331 to the electronic case 301.

The second coupling member 373 may pass through the first heat-sink plate 331, and then, may be coupled to the heat transfer plate 340. For example, the second coupling member 373 may include a screw.

When the second coupling member 373 is separated from the first heat-sink plate 331 and the heat transfer plate 340, the first heat-sink plate 331 may be separated from the heat transfer plate 340. That is, the first heat-sink plate 331 may be separated from the electronic case 301.

If it is intended to separate the cooling tube 105 to perform after-sales service, for example, repairing or replacement, for the electronic device 300 or the cooling tube 105, when the second coupling member 373 is separated, the electronic case 301 may be separated from the first heat-sink plate 331. Thus, the electronic case 301 may be easily separated to perform the after-sales service. Also, when the after-sales service for the electronic case 301 is finished, the first heat-sink plate 331 and the heat transfer plate 340 may be coupled to each other using the second coupling member 373 to easily assemble the electronic device 300.

According to the above-described embodiments, the cooling device of the electronic device 300 may be manufactured using only a relatively small number of coupling members.

A cooling operation of the electronic device 300 will now be described hereinbelow.

When the outdoor device 10 operates, high-temperature heat may be generated by operation of the component 355, such as the power module. The generated heat may be transferred into the first and second heat-sink plates 331 and 333 through the heat transfer plate 340.

As each of the first and second heat-sink plates 331 and 333 may be formed of aluminum or conductive plastic having superior thermal conductivity, the heat generated in the component may be quickly absorbed. Thus, the heat-sink plates 310 and 320 may increase in temperature.

While the air conditioner operates, the refrigerant cycle may be driven. The refrigerant condensed in the outdoor heat exchanger 200 may pass through the main expansion valve 260 to flow along the cooling tube 105, and then, may be introduced to the first and second heat-sink plates 331 and 333.

While refrigerant having a relatively low temperature passes through the first and second heat-sink plates 331 and 333, the first and second heat-sink plates 331 and 333 may be quickly cooled. That is, the cooling of the first and second heat-sink plates 331 and 333 may be effectively performed by a temperature difference between the refrigerant having a temperature of about 30° C. and the heat-sink plates 331 and 333 having a temperature of about 70° C. to about 80° C. The refrigerant discharged from the first and second heat-sink plates 331 and 333 may be introduced into the supercooling heat exchanger 270 through the supercooling distributor 271.

Hereinafter, a manipulation method when the electronic device or the cooling tube 105 is repaired or replaced will be described hereinbelow.

As described above, the first and second heat-sink plates 331 and 333 may be separably coupled to the electronic case 301 by the second coupling member 373. When the second coupling member 373 is released to separate the first and second heat-sink plates 331 and 333 from the heat transfer plate 340, the first and second heat-sink plates 331 and 333 may be separated from the electronic case 301. That is, the cooling tube 105 coupled to the first and second heat-sink plates 331 and 333 may be separated from the electronic case 301 without performing another manipulation operation. Thus, after-sales service with respect to the separated cooling tube 105 or the electronic case 301 may be easily performed.

When the after-sales service with respect to the electronic device 300 or the cooling tube 105 is finished, the cooling tube 105 and the first and second heat-sink plates 331 and 333 may be easily assembled with each other in reverse order to the above-described order.

According to embodiments disclosed herein, as the electronic device is cooled using refrigerant heat circulated into the refrigeration cycle, it may prevent control components provided in the electronic device from malfunctioning, and also prevent the air conditioner from breaking down.

Also, the electronic board on which the component that generates high heat is disposed and the heat transfer plate may be disposed inside the electronic case, and the heat-sink plate, which may contact the heat transfer plate and the cooling tube, may be disposed outside of the electronic case. Thus, when the electronic case is separated from the cooling tube, only the heat-sink plate may be easily separated to easily perform an after-sales service with respect to the electronic device or the cooling tube.

Also, as the fixing guide extends from the electronic board to the heat transfer plate to fix the electronic board to the heat transfer plate, it may prevent the electronic board from being separated or breaking down due to vibration occurring when the outdoor device operates. Further, as the plurality of coupling guides may be provided on the inner surface of the electronic case to guide the coupling of the heat transfer plate, the heat transfer plate may be easily coupled to the electronic case. In addition, the heat transfer plate may be fixed in a position in a state in which the heat transfer plate is coupled to the electronic case.

Also, the electronic case, the heat transfer plate, and the fixing guide may be coupled to each other using one coupling member. Thus, when the electronic board is separated from the electronic case, only the one coupling member may be separated to easily perform after-sales service with respect to the electronic device.

Embodiments disclosed herein provide an air conditioner that is capable of efficiently cooling an electronic unit or device.

Embodiments disclosed herein provide an air conditioner that may include an electronic unit or device including a control component to drive a refrigerant cycle, and a cooling tube, through which a refrigerant to cool the electronic unit may flow. The cooling tube may be coupled to one side of the electronic unit. The electronic unit may include an electronic case having a through part or through hole; an electronic board, to which the control component may be coupled, the electronic board being disposed in the electronic case; a heat transfer plate disposed to contact the control component, the heat transfer plate being coupled to the electronic case; and a heat-sink plate, to which the cooling tube may be coupled. The heat-sink plate may contact the heat transfer plate through the through part.

The heat transfer plate may be supported by an inner surface of the electronic case, and the heat-sink plate may be supported by an outer surface of the electronic case. The control component may be disposed between the electronic board and the heat transfer plate.

The electronic board may further include a fixing guide, which may be spaced apart from the heat transfer plate and disposed on each of both sides of the heat transfer plate. The fixing guide may include a first guide part or guide coupled to the electronic board, and a second guide part or guide bent to extend from the first guide part. The second guide part may be coupled to the heat transfer plate.

The air conditioner may further include a spacer coupled between the first guide part of the fixing guide and the electronic board. The air conditioner may further include a plurality of coupling guides disposed in the electronic case to guide the heat transfer plate so that the heat transfer plate may be coupled to the inner surface of the electronic case. The heat transfer plate may be separably coupled in a space between the plurality of coupling guides.

The air conditioner may further include a first coupling member to couple the fixing guide and the heat transfer plate to the inner surface of the electronic case. The first coupling member may pass through the fixing guide and the heat transfer plate and be coupled to the electronic case.

The air conditioner may further include a second coupling member to couple the heat-sink plate to the electronic case. The second coupling member may pass through the heat-sink plate and be coupled to the heat transfer plate.

The through part may include a first through part or through hole and a second through part or through hole. The heat-sink plate may include first and second heat-sink plates, respectively, coupled to the first and second through parts.

The cooling tube may include a first cooling tube to guide a flow of the refrigerant in one or a first direction; a second cooling tube to guide the flow of the refrigerant in the other or a second direction; and a switching tube rounded or bent between the first cooling tube and the second cooling tube. The refrigerant may successively flow into the first cooling tube, the switching tube, and the second cooling tube. The air conditioner may further include an insertion part or portion, which may be formed by recessing at least one of the heat-sink plate, in which the first or second cooling tube may be placed.

The air conditioner may further include an outdoor heat exchanger, in which outdoor air and the refrigerant may be heat-exchanged with each other, and a main expansion valve, through which the refrigerant condensed in the outdoor heat exchanger may pass. The main expansion valve may be disposed on one side of the outdoor heat exchanger. The cooling tube may guide the refrigerant passing through the main expansion valve to a refrigerant passage of the heat-sink plate.

The air conditioner may further include a supercooling heat exchanger, into which the refrigerant passing through the heat-sink plate may be introduced, and a supercooling distributor disposed on an inlet-side of the supercooling heat exchanger to branch the refrigerant.

Embodiments disclosed herein may further provide an air conditioner that may include an electronic case; an electronic board coupled to a heat generation component, the electronic board being disposed in the electronic case; a cooling tube coupled to one side of the electronic board to guide a flow of a refrigerant; a heat-sink plate that accommodates the cooling tube, the heat-sink plate being separably coupled to the electronic case; a heat transfer plate disposed between the heat-sink plate and the heat generation component to transfer heat from the heat generation component into the heat-sink plate; a fixing guide coupled to each of both sides of the heat transfer plate; a spacer that spaces the electronic board from the fixing guide; a plurality of coupling guides disposed on an inner surface of the electronic case to guide coupling of the heat transfer plate; and a coupling member coupled to the heat-sink plate and the heat transfer plate to couple the heat-sink plate to an outer surface of the electronic case and couple the heat transfer plate to an inner surface of the electronic case. The coupling member may include a first coupling member that passes through the heat transfer plate, the first coupling member being coupled to the electronic case; and a second coupling member that passes through the heat-sink plate, the second coupling member being coupled to the heat transfer plate. The heat generation component may include an intelligent power module.

The heat generation component may be disposed to contact one or a first side surface of the heat transfer plate, and the heat-sink plate may be disposed to contact the other or a second side surface of the heat transfer plate. The heat-sink plate may be coupled to a through part or through hole of the electronic case at the outside of the electronic case, and the heat transfer plate may be disposed on the inner surface of the electronic case to contact the heat-sink plate.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An air conditioner, comprising:
an electronic device comprising a control component to drive a refrigerant cycle; and
a cooling tube, through which a refrigerant to cool the electronic device flows, the cooling tube being coupled to a side of the electronic device, wherein the electronic device comprises:
an electronic case having at least one through hole;
an electronic board, to which the control component is coupled, the electronic board being disposed within the electronic case;
at least one heat transfer plate disposed to contact the control component, the at least one heat transfer plate being coupled to the electronic case;
at least one heat sink, to which the cooling tube is coupled, wherein the at least one heat sink contacts the at least one heat transfer plate through the at least one through hole;
at least one fixing guide that is disposed on at least one lateral side of the at least one heat transfer plate and spaces the electronic board apart from the at least one heat transfer plate; and
a first coupling member that passes through the at least one fixing guide and the at least one heat transfer plate, and is coupled to the electronic case.

2. The air conditioner according to claim 1, wherein the at least one heat transfer plate is supported by an inner surface of the electronic case, and wherein the at least one heat sink is supported at an outer surface of the electronic case.

3. The air conditioner according to claim 2, wherein the control component is disposed between the electronic board and the at least one heat transfer plate.

4. The air conditioner according to claim 1, wherein the at least one fixing guide comprises first and second fixing guides disposed, respectively, on each of first and second lateral sides of the at least one heat transfer plate.

5. The air conditioner according to claim 1, wherein the at least one fixing guide comprises:
a first guide coupled to the electronic board; and
a second guide bent to extend from the first guide, the second guide being coupled to the at least one heat transfer plate.

6. The air conditioner according to claim 5, wherein the first coupling member is coupled to the second guide.

7. The air conditioner according to claim 5, further comprising a spacer disposed between the first guide of the at least one fixing guide and the electronic board.

8. The air conditioner according to claim 1, wherein the first coupling member couples the at least one fixing guide and the at least one heat transfer plate to an inner surface of the electronic case.

9. The air conditioner according to claim 8, further comprising a second coupling member to couple the at least one heat sink to the electronic case, wherein the second coupling member passes through the at least one heat sink and is coupled to the at least one heat transfer plate.

10. The air conditioner according to claim 1, further comprising a plurality of coupling guides disposed within the electronic case to support the at least one heat transfer plate such that the at least one heat transfer plate is coupled to an inner surface of the electronic case.

11. The air conditioner according to claim 10, wherein the at least one heat transfer plate is separably coupled in a space between the plurality of coupling guides.

12. The air conditioner according to claim 1, wherein the at least one through hole comprises a first through hole and a second through hole, and wherein the at least one heat sink comprises a first heat sink and a second heat sink, respectively, coupled to the first through hole and the second through hole.

13. The air conditioner according to claim 1, wherein the cooling tube comprises:
a first cooling tube that guides a flow of the refrigerant in a first direction;
a second cooling tube that guides the flow of the refrigerant in a second direction; and
a switching tube rounded or bent between the first cooling tube and the second cooling tube, wherein the refrigerant successively flows into the first cooling tube, the switching tube, and the second cooling tube.

14. The air conditioner according to claim 13, further comprising at least one recess formed in the at least one heat sink, in which the first or second cooling tube is received.

15. The air conditioner according to claim 1, further comprising:
an outdoor heat exchanger, in which outdoor air and the refrigerant are heat-exchanged with each other; and
a main expansion valve, through which refrigerant condensed in the outdoor heat exchanger passes, the main expansion valve being disposed on one side of the outdoor heat exchanger, wherein the cooling tube guides the refrigerant passing through the main expansion valve to a refrigerant passage of the at least one heat sink.

16. The air conditioner according to claim 1, further comprising:
a supercooling heat exchanger, in which the refrigerant passing through the at least one heat sink is introduced; and
a supercooling distributor disposed on an inlet-side of the supercoiling heat exchanger to branch the flow of the refrigerant.

17. The air conditioner according to claim 1, wherein the at least one heat sink comprises at least one heat sink plate.

18. An electronic device for an air conditioner, the electronic device comprising:
a case having at least one through hole;
an electronic board, to which a control component for the air conditioner is coupled, the electronic board being disposed within the case;
at least one heat transfer plate disposed to contact the control component, the at least one heat transfer plate being coupled to the case;
at least one heat sink configured to be coupled to a cooling tube of the air conditioner, wherein a first surface of the at least one heat sink contacts the at least one heat transfer plate through the at least one through hole, and wherein a second surface of the at least one heat sink, disposed opposite to the first surface, is disposed outside of the case;
at least one fixing guide that is disposed on at least one lateral side of the at least one heat transfer plate and spaces the electronic board apart from the at least one heat transfer plate; and
a first coupling member that passes through the at least one fixing guide and the at least one heat transfer plate, and is coupled to the electronic case.

19. The electronic device according to claim 18, wherein the at least one heat transfer plate is supported by an inner surface of the electronic case, and wherein the at least one heat sink is supported at an outer surface of the electronic case.

20. The electronic device according to claim 18, wherein the control component is disposed between the electronic board and the at least one heat transfer plate.

21. The electronic device according to claim 18, further comprising a plurality of coupling guides disposed within the electronic case to support the at least one heat transfer plate such that the at least one heat transfer plate is coupled to an inner surface of the electronic case.

22. The electronic device according to claim 18, wherein the at least one through hole comprises a first through hole and a second through hole, and wherein the at least one heat sink comprises a first heat sink and a second heat sink, respectively, coupled to the first through hole and the second through hole.

23. The electronic device according to claim 22, further comprising at least one recess formed in each of the first heat sink and the second heat sink configured to receive the cooling tube of the air conditioner.

* * * * *

UNITED STATES PATENT AND TRADEMARK OFFICE
CERTIFICATE OF CORRECTION

PATENT NO.        : 9,807,907 B2
APPLICATION NO.   : 14/487539
DATED             : October 31, 2017
INVENTOR(S)       : Hakjin Lee, Taegeol Kim and Seokhoon Jang Page 1 of 1

It is certified that error appears in the above-identified patent and that said Letters Patent is hereby corrected as shown below:

On the Title Page

Insert:
--(30) Foreign Application Priority Data
September 16, 2013    KR 10-2013-0110929--

Signed and Sealed this
Eighth Day of May, 2018

Andrei Iancu
*Director of the United States Patent and Trademark Office*